US009450092B2

(12) United States Patent
Rakshit et al.

(10) Patent No.: US 9,450,092 B2
(45) Date of Patent: Sep. 20, 2016

(54) STRESS IN TRIGATE DEVICES USING COMPLIMENTARY GATE FILL MATERIALS (71) Applicant: Intel Corporation, Santa Clara, CA (US)

(72) Inventors: Titash Rakshit, Hillsboro, OR (US); Martin Giles, Portland, OR (US); Ravi Pillarisetty, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/938,812

(22) Filed: Nov. 11, 2015

(65) Prior Publication Data

US 2016/0064562 A1    Mar. 3, 2016

Related U.S. Application Data (60) Continuation of application No. 14/273,377, filed on May 8, 2014, now Pat. No. 9,224,754, which is a continuation of application No. 13/750,393, filed on Jan. 25, 2013, now Pat. No. 8,741,733, which is a division of application No. 12/144,469, filed on Jun. 23, 2008, now Pat. No. 8,362,566.

(51) Int. Cl.
| H01L 21/70 | (2006.01) |
|---|---|
| H01L 29/78 | (2006.01) |
| H01L 21/8238 | (2006.01) |
| H01L 29/66 | (2006.01) |
| H01L 21/8234 | (2006.01) |
| H01L 27/12 | (2006.01) |

(52) U.S. Cl.
CPC ....... *H01L 29/7845* (2013.01); *H01L 21/8234* (2013.01); *H01L 21/823807* (2013.01); *H01L 21/823828* (2013.01); *H01L 27/1211* (2013.01); *H01L 29/66795* (2013.01); *H01L 29/785* (2013.01); *H01L 29/7831* (2013.01)

(58) Field of Classification Search
USPC ................... 257/368, 351, E21.616
See application file for complete search history.

(56) References Cited

U.S. PATENT DOCUMENTS

| 3,387,820 A | 6/1968 | Sanderfer et al. |
| 4,231,149 A | 11/1980 | Chapman et al. |

(Continued)

FOREIGN PATENT DOCUMENTS

| DE | 102 03 998 A1 | 8/2003 |
| EP | 0265314 | 4/1988 |

(Continued)

OTHER PUBLICATIONS

Auth et al., "Vertical, Fully-Depleted, Surroundings Gate MOSFETS on sub-0.1um Thick Silicon Pillars", 1996 54th Annual Device Research Conference Digest, pp. 108-109 (1996).

(Continued)

*Primary Examiner* — Timor Karimy
(74) *Attorney, Agent, or Firm* — Blakely, Sokoloff, Taylor & Zafman LLP (57) ABSTRACT Embodiments relate to an improved tri-gate device having gate metal fills, providing compressive or tensile stress upon at least a portion of the tri-gate transistor, thereby increasing the carrier mobility and operating frequency. Embodiments also contemplate method for use of the improved tri-gate device.

20 Claims, 5 Drawing Sheets

(56) References Cited

U.S. PATENT DOCUMENTS

| | | |
|---|---|---|
| 4,487,652 A | 12/1984 | Almgren |
| 4,711,701 A | 12/1987 | McLevige |
| 4,751,201 A | 6/1988 | Nottenburg et al. |
| 4,818,715 A | 4/1989 | Chao |
| 4,871,692 A | 10/1989 | Lee et al. |
| 4,872,046 A | 10/1989 | Morkoc et al. |
| 4,905,063 A | 2/1990 | Beltram et al. |
| 4,906,589 A | 3/1990 | Chao |
| 4,907,048 A | 3/1990 | Huang |
| 4,914,059 A | 4/1990 | Nissim et al. |
| 4,994,873 A | 2/1991 | Madan |
| 4,996,574 A | 2/1991 | Shirasaki |
| 5,023,203 A | 6/1991 | Choi |
| 5,120,666 A | 6/1992 | Gotou |
| 5,124,777 A | 6/1992 | Lee |
| 5,179,037 A | 1/1993 | Seabaugh |
| 5,216,271 A | 6/1993 | Takagi et al. |
| 5,218,213 A | 6/1993 | Gaul et al. |
| 5,278,012 A | 1/1994 | Yamanaka et al. |
| 5,278,102 A | 1/1994 | Horie |
| 5,308,999 A | 5/1994 | Gotou |
| 5,328,810 A | 7/1994 | Lowrey et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,371,024 A | 12/1994 | Hieda et al. |
| 5,391,506 A | 2/1995 | Tada et al. |
| 5,398,641 A | 3/1995 | Shih |
| 5,428,237 A | 6/1995 | Yuzurihara et al. |
| 5,466,621 A | 11/1995 | Hisamoto et al. |
| 5,475,869 A | 12/1995 | Gomi et al. |
| 5,479,033 A | 12/1995 | Baca et al. |
| 5,482,877 A | 1/1996 | Rhee |
| 5,495,115 A | 2/1996 | Kudo et al. |
| 5,514,885 A | 5/1996 | Myrick |
| 5,521,859 A | 5/1996 | Ema et al. |
| 5,539,229 A | 7/1996 | Noble, Jr. et al. |
| 5,543,351 A | 8/1996 | Hirai et al. |
| 5,545,586 A | 8/1996 | Koh et al. |
| 5,554,870 A | 9/1996 | Fitch et al. |
| 5,563,077 A | 10/1996 | Ha |
| 5,576,227 A | 11/1996 | Hsu |
| 5,578,513 A | 11/1996 | Maegawa |
| 5,595,919 A | 1/1997 | Pan |
| 5,595,941 A | 1/1997 | Okamoto et al. |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,698,869 A | 12/1997 | Yoshimi et al. |
| 5,701,016 A | 12/1997 | Burroughs et al. |
| 5,716,879 A | 2/1998 | Choi et al. |
| 5,739,544 A | 4/1998 | Yuki et al. |
| 5,760,442 A | 6/1998 | Shigyo et al. |
| 5,770,513 A | 6/1998 | Okaniwa |
| 5,773,331 A | 6/1998 | Solomon et al. |
| 5,776,821 A | 7/1998 | Haskell et al. |
| 5,793,088 A | 8/1998 | Choi et al. |
| 5,804,848 A | 9/1998 | Mukai |
| 5,811,324 A | 9/1998 | Yang |
| 5,814,895 A | 9/1998 | Hirayama et al. |
| 5,821,629 A | 10/1998 | Wen et al. |
| 5,827,769 A | 10/1998 | Aminzadeh et al. |
| 5,844,278 A | 12/1998 | Mizuno et al. |
| 5,856,225 A | 1/1999 | Lee et al. |
| 5,859,456 A | 1/1999 | Efland et al. |
| 5,880,015 A | 3/1999 | Hata |
| 5,883,564 A | 3/1999 | Partin |
| 5,888,309 A | 3/1999 | Yu |
| 5,889,304 A | 3/1999 | Watanabe et al. |
| 5,899,710 A | 5/1999 | Mukai |
| 5,905,285 A | 5/1999 | Gardner et al. |
| 5,908,313 A | 6/1999 | Chau et al. |
| 5,952,701 A | 9/1999 | Bulucea et al. |
| 5,965,914 A | 10/1999 | Miyamoto |
| 5,976,767 A | 11/1999 | Li |
| 5,981,400 A | 11/1999 | Lo |
| 5,985,726 A | 11/1999 | Yu et al. |
| 6,013,926 A | 1/2000 | Oku et al. |
| 6,018,176 A | 1/2000 | Lim |
| 6,031,249 A | 2/2000 | Yamazaki et al. |
| 6,051,452 A | 4/2000 | Shigyo et al. |
| 6,054,355 A | 4/2000 | Inumiya et al. |
| 6,063,675 A | 5/2000 | Rodder |
| 6,063,677 A | 5/2000 | Rodder et al. |
| 6,066,869 A | 5/2000 | Noble et al. |
| 6,087,208 A | 7/2000 | Krivokapic et al. |
| 6,093,621 A | 7/2000 | Tseng |
| 6,114,201 A | 9/2000 | Wu |
| 6,114,206 A | 9/2000 | Yu |
| 6,117,697 A | 9/2000 | Seaford et al. |
| 6,117,741 A | 9/2000 | Chatterjee et al. |
| 6,120,846 A | 9/2000 | Hintermaier et al. |
| 6,130,123 A | 10/2000 | Liang et al. |
| 6,133,593 A | 10/2000 | Boos et al. |
| 6,144,072 A | 11/2000 | Iwamatsu et al. |
| 6,150,222 A | 11/2000 | Gardner et al. |
| 6,153,485 A | 11/2000 | Pey et al. |
| 6,159,808 A | 12/2000 | Chuang |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,200,865 B1 | 3/2001 | Gardner et al. |
| 6,218,309 B1 | 4/2001 | Miller et al. |
| 6,251,729 B1 | 6/2001 | Montree et al. |
| 6,251,751 B1 | 6/2001 | Chu et al. |
| 6,251,763 B1 | 6/2001 | Inumiya et al. |
| 6,252,262 B1 | 6/2001 | Jonker et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,262,456 B1 | 7/2001 | Yu et al. |
| 6,274,503 B1 | 8/2001 | Hsieh |
| 6,287,924 B1 | 9/2001 | Chao et al. |
| 6,294,416 B1 | 9/2001 | Wu |
| 6,307,235 B1 | 10/2001 | Forbes et al. |
| 6,310,367 B1 | 10/2001 | Yagishita et al. |
| 6,317,444 B1 | 11/2001 | Chakrabarti |
| 6,319,807 B1 | 11/2001 | Yeh et al. |
| 6,320,212 B1 | 11/2001 | Chow |
| 6,335,251 B2 | 1/2002 | Miyano et al. |
| 6,358,800 B1 | 3/2002 | Tseng |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,406,795 B1 | 6/2002 | Hwang et al. |
| 6,407,442 B2 | 6/2002 | Inoue et al. |
| 6,410,371 B1 | 6/2002 | Yu et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,457,890 B1 | 10/2002 | Kohlruss et al. |
| 6,458,662 B1 | 10/2002 | Yu |
| 6,459,123 B1 | 10/2002 | Enders et al. |
| 6,465,290 B1 | 10/2002 | Suguro et al. |
| 6,466,621 B1 | 10/2002 | Cougnard ET AL. |
| 6,472,258 B1 | 10/2002 | Adkisson et al. |
| 6,475,869 B1 | 11/2002 | Yu |
| 6,475,890 B1 | 11/2002 | Yu |
| 6,479,866 B1 | 11/2002 | Xiang |
| 6,483,146 B2 | 11/2002 | Lee |
| 6,483,151 B2 | 11/2002 | Wakabayashi et al. |
| 6,483,156 B1 | 11/2002 | Adkisson et al. |

(56) References Cited

U.S. PATENT DOCUMENTS

| | | |
|---|---|---|
| 6,495,403 B1 | 12/2002 | Skotnicki et al. |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,515,339 B2 | 2/2003 | Shin et al. |
| 6,525,403 B2 | 2/2003 | Inaba et al. |
| 6,526,996 B1 | 3/2003 | Chang et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,555,879 B1 | 4/2003 | Krivokapic et al. |
| 6,562,665 B1 | 5/2003 | Yu |
| 6,562,687 B1 | 5/2003 | Deleonibus |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,607,948 B1 | 8/2003 | Sugiyama et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,765,303 B1 | 7/2004 | Krivokapic et al. |
| 6,770,516 B2 | 8/2004 | Wu et al. |
| 6,774,390 B2 | 8/2004 | Sugiyama et al. |
| 6,780,694 B2 | 8/2004 | Doris et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,406 B1 | 9/2004 | Hill et al. |
| 6,787,439 B2 | 9/2004 | Ahmed et al. |
| 6,787,845 B2 | 9/2004 | Deieonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,831,310 B1 | 12/2004 | Matthew et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,588 B1 | 2/2005 | Liao et al. |
| 6,855,606 B2 | 2/2005 | Chen et al. |
| 6,855,990 B2 | 2/2005 | Yeo et al. |
| 6,858,472 B2 | 2/2005 | Schoenfeld |
| 6,858,478 B2 | 2/2005 | Chau et al. |
| 6,864,519 B2 | 3/2005 | Yeo et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maede et al. |
| 6,881,635 B1 | 4/2005 | Chidambarrao et al. |
| 6,884,154 B2 | 4/2005 | Mizushima et al. |
| 6,885,055 B2 | 4/2005 | Lee |
| 6,888,199 B2 | 5/2005 | Nowak et al. |
| 6,890,811 B2 | 5/2005 | Hou et al. |
| 6,891,234 B1 | 5/2005 | Connelly et al. |
| 6,897,527 B2 | 5/2005 | Dakshina-Murthy et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2 | 6/2005 | Hareland et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,946,377 B2 | 9/2005 | Chambers |
| 6,949,433 B1 | 9/2005 | Hidehiko et al. |
| 6,955,961 B1 | 10/2005 | Chung |
| 6,955,969 B2 | 10/2005 | Djomehri et al. |
| 6,956,281 B2 | 10/2005 | Smith et al. |
| 6,960,517 B2 | 11/2005 | Rios et al. |
| 6,967,351 B2 | 11/2005 | Fried et al. |
| 6,969,878 B2 | 11/2005 | Coronel et al. |
| 6,970,373 B2 | 11/2005 | Datta et al. |
| 6,974,738 B2 | 12/2005 | Hareland |
| 6,975,014 B1 | 12/2005 | Krivokapic et al. |
| 6,977,415 B2 | 12/2005 | Matsuo |
| 6,982,433 B2 | 1/2006 | Hoffman et al. |
| 6,998,301 B1 | 2/2006 | Yu et al. |
| 6,998,318 B2 | 2/2006 | Park |
| 7,005,366 B2 | 2/2006 | Chau et al. |
| 7,013,447 B2 | 3/2006 | Mathew et al. |
| 7,018,551 B2 | 3/2006 | Beintner et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,045,451 B2 | 5/2006 | Shenai-Khatkhate et al. |
| 7,049,654 B2 | 5/2006 | Chang |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,074,656 B2 | 7/2006 | Yeo |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,891 B2 | 9/2006 | Visokay et al. |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,945 B2 | 10/2006 | Lee et al. |
| 7,115,954 B2 | 10/2006 | Shimizu et al. |
| 7,119,402 B2 | 10/2006 | Kinoshita et al. |
| 7,122,463 B2 | 10/2006 | Ohuchi |
| 7,132,360 B2 | 11/2006 | Schaeffer et al. |
| 7,138,320 B2 | 11/2006 | Bentum et al. |
| 7,141,480 B2 | 11/2006 | Adam et al. |

(56) References Cited

U.S. PATENT DOCUMENTS

| | | |
|---|---|---|
| 7,141,856 B2 | 11/2006 | Lee et al. |
| 7,154,118 B2 | 12/2006 | Lindert |
| 7,163,851 B2 | 1/2007 | Abadeer et al. |
| 7,163,898 B2 | 1/2007 | Mariani et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,196,372 B1 | 3/2007 | Yu et al. |
| 7,214,991 B2 | 5/2007 | Yeo et al. |
| 7,238,564 B2 | 7/2007 | Ko et al. |
| 7,241,653 B2 | 7/2007 | Hareland et al. |
| 7,247,547 B2 | 7/2007 | Zhu et al. |
| 7,247,578 B2 | 7/2007 | Brask |
| 7,250,367 B2 | 7/2007 | Vaartstra et al. |
| 7,250,645 B1 | 7/2007 | Wang et al. |
| 7,250,655 B2 | 7/2007 | Bae et al. |
| 7,256,455 B2 | 8/2007 | Ahmed et al. |
| 7,268,024 B2 | 9/2007 | Yeo et al. |
| 7,268,058 B2 | 9/2007 | Chau et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,326,634 B2 | 2/2008 | Lindert et al. |
| 7,329,913 B2 | 2/2008 | Brask et al. |
| 7,339,241 B2 | 3/2008 | Orlowski et al. |
| 7,341,902 B2 | 3/2008 | Anderson et al. |
| 7,348,284 B2 | 3/2008 | Doyle et al. |
| 7,348,642 B2 | 3/2008 | Nowak |
| 7,354,817 B2 | 4/2008 | Watanabe et al. |
| 7,358,121 B2 | 4/2008 | Chau et al. |
| 7,385,262 B2 | 6/2008 | O'Keefee et al. |
| 7,388,259 B2 | 6/2008 | Doris et al. |
| 7,396,730 B2 | 7/2008 | Li |
| 7,439,120 B2 | 10/2008 | Pei |
| 7,452,778 B2 | 11/2008 | Chen et al. |
| 7,456,471 B2 | 11/2008 | Anderson et al. |
| 7,456,476 B2 | 11/2008 | Hareland et al. |
| 7,479,421 B2 | 1/2009 | Kavalieros et al. |
| 7,573,059 B2 | 8/2009 | Hudait et al. |
| 7,585,734 B2 | 9/2009 | Kang et al. |
| 7,612,416 B2 | 11/2009 | Takeuchi et al. |
| 7,655,989 B2 | 2/2010 | Zhu et al. |
| 7,674,669 B2 | 3/2010 | Hanafi |
| 7,701,018 B2 | 4/2010 | Yamagami et al. |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2002/0185655 A1 | 12/2002 | Fahimulla et al. |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino |
| 2003/0067017 A1 | 4/2003 | Ieong et al. |
| 2003/0080332 A1 | 5/2003 | Phillips |
| 2003/0080384 A1 | 5/2003 | Takahashi et al. |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0186167 A1 | 10/2003 | Johnson, Jr. et al. |
| 2003/0190766 A1 | 10/2003 | Gonzalez et al. |
| 2003/0201458 A1 | 10/2003 | Clark et al. |
| 2003/0203636 A1 | 10/2003 | Anthony |
| 2003/0227036 A1 | 12/2003 | Sugiyama et al. |
| 2004/0016968 A1 | 1/2004 | Coronel et al. |
| 2004/0029323 A1 | 2/2004 | Shimizu et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0110331 A1 | 6/2004 | Yeo et al. |
| 2004/0113181 A1 | 6/2004 | Wicker |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris et al. |
| 2004/0132567 A1 | 7/2004 | Schonnenbeck |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0169269 A1 | 9/2004 | Yeo et al. |
| 2004/0173815 A1 | 9/2004 | Yeo et al. |
| 2004/0173846 A1 | 9/2004 | Hergenrother et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219711 A1 | 11/2004 | Wu et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0253792 A1 | 12/2004 | Cohen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2004/0266076 A1 | 12/2004 | Doris et al. |
| 2005/0017377 A1 | 1/2005 | Joshi et al. |
| 2005/0019993 A1 | 1/2005 | Lee |
| 2005/0020020 A1 | 1/2005 | Collaert et al. |
| 2005/0023633 A1 | 2/2005 | Yeo et al. |
| 2005/0035391 A1 | 2/2005 | Lee et al. |
| 2005/0035415 A1 | 2/2005 | Yeo et al. |
| 2005/0040429 A1 | 2/2005 | Uppal |
| 2005/0040444 A1 | 2/2005 | Cohen |
| 2005/0059214 A1 | 3/2005 | Cheng et al. |
| 2005/0062082 A1 | 3/2005 | Bucher et al. |

(56) References Cited

U.S. PATENT DOCUMENTS

| | | |
|---|---|---|
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0104096 A1 | 5/2005 | Lee et al. |
| 2005/0110082 A1 | 5/2005 | Cheng |
| 2005/0116289 A1 | 6/2005 | Boyd et al. |
| 2005/0118790 A1 | 6/2005 | Lee et al. |
| 2005/0127362 A1 | 6/2005 | Zhang et al. |
| 2005/0127632 A1 | 6/2005 | Gehre |
| 2005/0133829 A1 | 6/2005 | Kunii et al. |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0162928 A1 | 7/2005 | Rosmeulen |
| 2005/0167766 A1 | 8/2005 | Yagishita |
| 2005/0170593 A1 | 8/2005 | Kang et al. |
| 2005/0184316 A1 | 8/2005 | Kim |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0202604 A1 | 9/2005 | Cheng et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224798 A1 | 10/2005 | Buss |
| 2005/0224800 A1 | 10/2005 | Lindert et al. |
| 2005/0227498 A1 | 10/2005 | Furkawa |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0255642 A1 | 11/2005 | Liu |
| 2005/0266645 A1 | 12/2005 | Park |
| 2005/0272192 A1 | 12/2005 | Oh et al. |
| 2005/0277294 A1 | 12/2005 | Schaefer et al. |
| 2005/0280121 A1 | 12/2005 | Doris et al. |
| 2005/0287752 A1 | 12/2005 | Nouri et al. |
| 2006/0014338 A1 | 1/2006 | Doris et al. |
| 2006/0040054 A1 | 2/2006 | Pearistein et al. |
| 2006/0043500 A1 | 3/2006 | Chen et al. |
| 2006/0046521 A1 | 3/2006 | Vaartstra et al. |
| 2006/0063469 A1 | 3/2006 | Talieh et al. |
| 2006/0068590 A1 | 3/2006 | Lindert et al. |
| 2006/0068591 A1 | 3/2006 | Radosavljevic et al. |
| 2006/0071275 A1 | 4/2006 | Brask et al. |
| 2006/0071299 A1 | 4/2006 | Doyle et al. |
| 2006/0086977 A1 | 4/2006 | Shah et al. |
| 2006/0138548 A1 | 6/2006 | Richards et al. |
| 2006/0148182 A1 | 7/2006 | Datta et al. |
| 2006/0154478 A1 | 7/2006 | Hsu et al. |
| 2006/0170066 A1 | 8/2006 | Mathew et al. |
| 2006/0172479 A1 | 8/2006 | Furukawa et al. |
| 2006/0172480 A1 | 8/2006 | Wang et al. |
| 2006/0172497 A1 | 8/2006 | Hareland et al. |
| 2006/0180859 A1 | 8/2006 | Radosavljevic et al. |
| 2006/0202270 A1 | 9/2006 | Son et al. |
| 2006/0204898 A1 | 9/2006 | Gutsche et al. |
| 2006/0205164 A1 | 9/2006 | Ko et al. |
| 2006/0211184 A1 | 9/2006 | Boyd et al. |
| 2006/0220131 A1 | 10/2006 | Kinoshita et al. |
| 2006/0227595 A1 | 10/2006 | Chuang et al. |
| 2006/0240622 A1 | 10/2006 | Lee et al. |
| 2006/0244066 A1 | 11/2006 | Yeo et al. |
| 2006/0263699 A1 | 11/2006 | Abatchev et al. |
| 2006/0281325 A1 | 12/2006 | Chou et al. |
| 2006/0286729 A1 | 12/2006 | Kavalieros et al. |
| 2007/0001219 A1 | 1/2007 | Radosavljevic et al. |
| 2007/0004117 A1 | 1/2007 | Yagishita |
| 2007/0023795 A1 | 2/2007 | Nagano et al. |
| 2007/0029624 A1 | 2/2007 | Nowak |
| 2007/0045735 A1 | 3/2007 | Orlowski et al. |
| 2007/0045748 A1 | 3/2007 | Booth et al. |
| 2007/0048930 A1 | 3/2007 | Figura et al. |
| 2007/0052041 A1 | 3/2007 | Sorada et al. |
| 2007/0069293 A1 | 3/2007 | Kavalieros et al. |
| 2007/0069302 A1 | 3/2007 | Jin et al. |
| 2007/0090416 A1 | 4/2007 | Doyle et al. |
| 2007/0093010 A1 | 4/2007 | Mathew et al. |
| 2007/0108514 A1 | 5/2007 | Inoue et al. |
| 2007/0145487 A1 | 6/2007 | Kavalieros et al. |
| 2007/0187682 A1 | 8/2007 | Takeuchi et al. |
| 2007/0241414 A1 | 10/2007 | Narihiro |
| 2007/0259501 A1 | 11/2007 | Xiong et al. |
| 2007/0262389 A1 | 11/2007 | Chau et al. |
| 2008/0017890 A1 | 1/2008 | Yuan et al. |
| 2008/0017934 A1 | 1/2008 | Kim et al. |
| 2008/0111163 A1 | 5/2008 | Russ et al. |
| 2008/0116515 A1 | 5/2008 | Gossner et al. |
| 2008/0128796 A1 | 6/2008 | Zhu et al. |
| 2008/0128797 A1 | 6/2008 | Dyer et al. |
| 2008/0212392 A1 | 9/2008 | Bauer |
| 2008/0217700 A1 | 9/2008 | Doris et al. |
| 2008/0237655 A1 | 10/2008 | Nakabayashi et al. |
| 2008/0258207 A1 | 10/2008 | Radosavljevic et al. |
| 2009/0061572 A1 | 3/2009 | Hareland et al. |
| 2009/0090976 A1 | 4/2009 | Kavalieros et al. |
| 2009/0099181 A1 | 4/2009 | Wurster et al. |
| 2010/0200923 A1 | 8/2010 | Chen et al. |

FOREIGN PATENT DOCUMENTS

| | | |
|---|---|---|
| EP | 0469604 | 2/1992 |
| EP | 0510667 | 10/1992 |
| EP | 0 623 963 A1 | 11/1994 |
| EP | 1 091 413 A2 | 4/2001 |
| EP | 1 202 335 A2 | 5/2002 |
| EP | 1 566 844 A2 | 8/2005 |
| GB | 2 156 149 A | 10/1985 |
| JP | 56073454 A | 6/1981 |
| JP | 59145538 A | 8/1984 |
| JP | 02 303048 A | 12/1990 |
| JP | 05090252 | 4/1993 |
| JP | 0600 5856 | 1/1994 |
| JP | 06-151387 A | 5/1994 |
| JP | 6132521 | 5/1994 |
| JP | 06 177089 A | 6/1994 |
| JP | 06224440 A | 8/1994 |
| JP | 7-50421 A | 2/1995 |
| JP | 09-162301 A | 6/1997 |
| JP | 2000 037842 A | 2/2000 |
| JP | 2001-189453 | 7/2001 |
| JP | 2001 338987 | 12/2001 |
| JP | 2002-298051 | 10/2002 |
| JP | 2002-110977 A | 12/2002 |
| JP | 2003229575 | 8/2003 |
| JP | 2003-298051 | 10/2003 |
| JP | 2005085916 | 3/2005 |
| KR | 10 0222363 | 10/1999 |
| TW | 2004 14538 | 8/1992 |
| TW | I321830 | 9/1995 |
| TW | 2005 18310 | 11/1998 |
| TW | 508669 | 11/2002 |
| TW | 516232 | 1/2003 |
| TW | 561530 | 1/2003 |
| TW | 546713 | 8/2003 |
| TW | 548799 | 8/2003 |
| TW | 2004 02872 | 2/2004 |
| TW | 2004 05408 | 4/2004 |
| TW | 591798 | 6/2004 |
| TW | 594990 | 6/2004 |
| TW | 2004 14539 | 8/2004 |
| TW | 2004 17034 | 9/2004 |

(56) References Cited

FOREIGN PATENT DOCUMENTS

| TW | I223449 | 11/2004 |
|---|---|---|
| TW | I231994 | 5/2005 |
| TW | I238524 | 8/2005 |
| TW | I239102 | 9/2005 |
| TW | 200729407 | 8/2007 |
| WO | WO-9106976 | 5/1991 |
| WO | WO 02/43151 A1 | 5/2002 |
| WO | WO 02/095814 | 11/2002 |
| WO | WO 03/003442 | 1/2003 |
| WO | WO 2004/059726 A1 | 7/2004 |
| WO | WO 2005/034212 A2 | 4/2005 |
| WO | WO 2005/036651 A1 | 4/2005 |
| WO | WO 2005/098963 A1 | 10/2005 |
| WO | WO 2006/007350 A1 | 1/2006 |
| WO | WO 2006/078469 A1 | 7/2006 |
| WO | WO 2007/002426 A2 | 1/2007 |
| WO | WO 2007/041152 A1 | 4/2007 |
| WO | WO-2007038575 | 4/2007 |

OTHER PUBLICATIONS

Breed, A., et al., "Dual-gate (FinFET) and tri-gate MOSFETs: simulation and design", Semiconductor Device Research Symposium, 2003 International, Dec. 10-12, 2003, pp. 150-151.

Buchanan, D. A., et al., "Fabrication of Midgap Metal Gates Compatible with Ultrathin Dielectrics," Applied Physics Letters, 73.12, (Sep. 21, 1998), pp. 1676-1678.

Burenkov, A. et al., "Corner Effect in Double and Triple Gate FINFETs", European Solid-State Device Research, 2003 33rd Conference on Essderc '03 Sep. 2003, Piscataway, NJ, USA, IEEE, pp. 135-138, XP010676716.

Chang, L., et al., "CMOS Circuit Performance Enhancement by Surface Orientation Optimization," IEEE Transactions on Electron Devices, IEEE Service Center, Piscataway, NJ, vol. 51, No. 10, Oct. 2004, pp. 1621-1627 XP001211140.

Chang, S.T. et al, "3-D Simulation of Strained Si/SiGe Heterojunction FinFETS", Semiconductor Device Research Symposium, 2003 International, Dec. 2003, Piscataway, NJ, USA, IEEE, pp. 176-177, XP010687197.

Chau, R., "Advanced Metal Gate/High-K Dielectric Stacks for High-Performance CMOS Transistors", Proceedings of AVS 5th International Conference of Microelectronics and Interfaces, Mar. 2004, (3 pgs.).

Chau, Robert et al., Advanced Depleted-Substrate Transistors: Single-gate, Double-gate and Tri-gate (Invited Paper), Components Research, Logic Technology Development, Intel Corporation, Hillsboro, OR, (2 pgs.).

Choi, Yang-Kyu et al., "A Spacer Patterning Technology for Nanoscale CMOS," IEEE Transactions on Electron Devices, vol. 49, No. 3, Mar. 2002, pp. 436-441.

Choi, Yang-Kyu et al., "Sub-20nm CMOS FinFET Technologies", Department of Electrical Engineering and Computer Sciences, University of California, Berkeley, CA 94720, USA, email: ykchoi@eecs.berkeley.edu, Tel: +1-510-643-2558, pp. 19.1.1-19.1.4.

Claflin, B., et al., "Interface Studies of Tungsten Nitride and Titanium Nitride Composite Metal Gate Electrodes with Thin Dielectric Layers," Journal of Vacuum Science and Technology A 16.3, (May/Jun. 1998), pp. 1757-1761.

Collaert, N. et al. "A Functional 41-Stage ring oscillator using scaled FinFET devices with 25-nm gate lengths and 10-nm fin widths applicable for the 45-nm CMOS node" IEEE Electron Device Letters, vol. 254, No. 8 (Aug. 2004), pp. 568-570.

Fried, David M. et al., "High-Performance P-Type Independent-Gate FinFETs," IEEE Electron Device Letters, vol. 25, No. 4, Apr. 2004, pp. 199-201.

Fried, David M. et al., "Improved Independent Gate N-Type FinFET Fabrication and Characterization", IEEE Electron Device Letters, vol. 24, No. 9, Sep. 2003, pp. 592-594.

Guo, Jing et al., "Performance Projections for Ballistic Carbon Nanotube Field-Effect Transistors," Applied Physics Letters, vol. 80, No. 17, Apr. 29, 2002, pp. 2192-2194.

Hisamoto et al., "A Folded-channel MOSFET for Deep-sub-tenth Micron Era", 1998 IEEE International Electron Device Meeting Technical Digest, pp. 1032-1034 (1998).

Hisamoto et al., "A Fully Depleted Lean-Channel Transistor (DELTA)—A Novel Vertical Ultrathin SOI MOSFET", IEEE Electron Device Letters, (1990) V. 11(1), pp. 36-38.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

Huang et al., "Sub 50-nm FinFET: PMOS", 1999 IEEE International Electron Device Meeting Technical Digest, (1999) pp. 67-70.

Hwang, Jeong-Mo et al., "Novel Polysilicon/Tin Stacked-Gate Structure for Fully-Depleted SOI/CMOS," International Electronic Devices Meeting Technical Digest, (1992), pp. 345-348.

Ieong, M. et al., Three Dimensional CMOS Devices and Integrated Circuits, IEEE 2003 CICC, San Jose, CA, Sep. 21-24, 2003, pp. 207-214.

Javey, Ali et al., "Ballistic Carbon Nanotube Field-Effect Transistors", Nature, vol. 424, Aug. 7, 2003, pp. 654-657.

Javey, Ali et al., "High-K Dielectrics for Advanced Carbon-Nanotube Transistors and Logic Gates", Advance Online Publication, Published online, Nov. 17, 2002, pp. 1-6.

Jin, B. et al., "Mobility Enhancement in Compressively Strained SIGE Surface Channel PMOS Transistors with HF02/TIN Gate Stack", Proceedings of the First Joint International Symposium, 206th Meeting of Electrochemical Society, Oct. 2004, pp. 111-122.

Jones, E. C., "Doping Challenges in Exploratory Devices for High Performance Logic", 14th Int'l. Conference, Piscataway, NJ, Sep. 22-27, 2002, pp. 1-6.

Kim, Sung Min, et al., A Novel Multi-Channel Field Effect Transistor (McFET) on Bulk Si for High Performance Sub-80nm Application, IEDM 04-639, 2004 IEEE, pp. 27.4.1-27.4.4.

Kuo, Charles et al. "A Capacitorless Double Gate DRAM Technology for Sub-100-nm Embedded and Stand-Alone Memory Applications," IEEE Transactions on Electron Devices, vol. 50, No. 12, Dec. 2003, pp. 2408-2416.

Kuo, Charles et al., "A Capacitorless Double-Gate DRAM Cell Design for High Density Applications", 2002 IEEE International Electron Devices Meeting Technical Digest, Dec. 2002, pp. 843-846.

Lide, David R. "Properties of Semiconductors" CRC Handbook of Chemistry and Physics, internet version 2007, (87th edition), David R. Lide—Editor; Taylor and Francis, pp. 12-77-12-89.

Ludwig et al., "FinFET Technology for Future Microprocessors" 2003 IEEE, pp. 33-34.

Martel, Richard et al., "Carbon Nanotube Field Effect Transistors for Logic Applications" IBM, T.J. Watson Research Center, 2001 IEEE, IEDM 01, pp. 159-162.

Mayer, T.M., et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

Nackaerts et al., "A 0.314µm² 6T-SRAM Cell build with Tall Triple-Gate Devices for 45nm node applications using 0.75NA 193nm lithography," IDEM, (Dec. 13, 2004), pp. 269-272.

Nowak, E. J., et al., "A Functional FinFET-DGCMOS SRAM Cell", Int'l Electron Devices Meeting 2002, San Francisco, CA, Dec. 8-11, 2002, pp. 411-414.

Nowak, E. J., et al., "Scaling Beyond the 65 nm Node with FinFET-DGCMOS", IEEE 2003 CICC, San Jose, CA, Sep. 21-24, 2003, pp. 339-342.

Nowak, Edward J. et al., "Turning Silicon On Its Edge . . . ," IEEE Circuits & Devices Magazine, vol. 1, (Jan./Feb. 2004), pp. 20-31.

Ohsawa, Takashi et al., "Memory Design Using a One-Transistor Gain Cell on SOI", IEEE Journal of Solid-State Circuits, vol. 37, No. 11, Nov. 2002, pp. 1510-1522.

Park, Donggun et al., "3-Dimensional nano-CMOS Transistors to Overcome Scaling Limits," IEEE 2004, ISBN 0-7803-8511-X, (Oct. 18, 2004), pp. 35-40.

(56) References Cited

OTHER PUBLICATIONS

Park, Jong-Tae, et al., "Pi-Gate SOI MOSFET". IEEE Electron Device Letters, vol. 22, No. 8, Aug. 2001, pp. 405-406.
Park, T. et al., "PMOS Body-Tied FinFET (Omega MOSFET) Characteristics", Device Research Conference, Piscataway, NJ, Jun. 23-25, 2003, IEEE Jun. 2003, pp. 33-34.
Park, T. et al., "Fabrication of Body-Tied FinFETs (Omega MOSFETs) Using Bulk Si Wafers", 2003 Symposia on VLSI Technology Digest of Technical Papers, Jun. 2003, pp. 135-136.
Seevinck, Evert et al., "Static-Noise Margin Analysis of MOS SRAM Cells" 1987 IEEE, IEEE Journal of Solid-State Circuits, vol. SC-22, No. 5, Oct. 1987.
Stadele et al., "A Comprehensive Study of Corner Effects in Tri-gate Transistors," IEEE 2004, pp. 165-168.
Stolk, Peter A. et al., "Modeling Statistical Dopant Fluctuations in MOS Transistors", 1998 IEEE, IEEE Transactions on Electron Devices, vol. 45, No. 9, Sep. 1998, pp. 1960-1971.
Subramanian, V., et al., "A Bulk-Si-Compatible Ultrathin-body SOI Technology for sub-100nm MOSFETs" Proceeding of the 57th Annual Device Research Conference, (1999) pp. 28-29.
Sugizaki, T. et al., "Novel Multi-bit SONOS Type Flash Memory Using a High-k Charge Trapping Layer," VLSI Technology, 2003, Digest of Technical Papers, Symposium on, Jun. 10-12, 2003, (2003), pp. 27-28.
Tanaka, T. et al., Scalability Study on a Capacitorless 1T-DRAM: From Single-gate PD-SOI to Double-Gate FinDRAM, 2004 IEEE International Electron Devices Meeting Technical Digest, Dec. 2004, (4 pgs.).
Tang, Stephen H. et al., "FinFET—A quasi-planar double-gate MOSFET", 2001 IEEE International Solid-State Circuits Conference (Feb. 6, 2001), pp. 1-3.
Tokoro, Kenji et al., "Anisotropic Etching Properties of Silicon in KOH and TMAH Solutions," International Symposium on Micromechatronics and Human Science, IEEE (1998), pp. 65-70.
Wang, X. , et al., "Band alignments in sidewall strained Si/strained SiGe heterostructures", (May 28, 2002), 1-5.
Wolf, Stanley et al., "Wet Etching Silicon," Silicon Processing for the VLSI Era, vol. 1: Process Technology, Lattice Press, Sunset Beach, CA, (Sep. 1986), (3 pgs.).
Xiong, W., et al., "Corner Effect in Multiple-Gate SOI MOSFETs" 2003 IEEE, pp. 111-113.
Xiong, Weize et al., "Improvement of FinFET Electrical Characteristics by Hydrogen Annealing," IEEE Electron Device Letters, vol. 25, No. 8, Aug. 2004, XP-001198998, pp. 541-543.
Yang, Fu-Liang et al., "25nm CMOS Omega FETs" IEEE 2002, 10.3.1-10-.3.4, pp. 255-258.
Yang, Fu-Liang, et al., "5nm-Gate Nanowire FinFET," 2004 Symposium on VLSI Technology Digest of Technical Papers, 2004 IEEE, pp. 196-197.
Ashley, T , et al., "High-Speed, Low-Power InSb Transistors", IEDM 97, pp. 751-754.
Ashley, et al., "Novel InSb-based Quantum Well Transistors for Ultra-High Speed, Low Power Logic Applications", Solid-State and Integrated Circuits Technology, 7th International Conference on, Beijing 2004, IEEE vol. 3, 4 Pages.
Balakrishnan, G. , et al., "Room-Temperature Optically-Pumped InGaSb Quantum Well Lasers Monolithically Grown on Si (100) Substrate", IEE 2005, 2 pages, (Feb. 12, 2005).
Bednyi, et al., "Electronic State of the Surface of INP Modified by Treatment in Sulfur Vapor", Bednyi, et al., "Electronic State of the Surface of INP Modified by Treatment in Sulfur Vapor", Soviet Physics Semiconductors, Am. Inst. of Physics, New York, vol. 26, No. 8, Aug. 1, 1992.
Bessolov, V N., et al., "Chalcogenide passivation of III-V semiconductor surfaces", Semiconductores, vol. 32, Nov. 1998, pp. 1141-1156.
Datta, et al., "85nm Gate Length Enhancement and Depletion Mode InSb Quantum Well Transistors for Ultra High Speed and Very Low Power Digital Logic Applications", Datta, et al., "85nm Gate Length Enhancement and Depletion Mode InSb Quantum Well Transistors for Ultra High Speed and Very Low Power Digital Logic Applications", IEEE Dec. 5, 2005, pp. 763-766, (Dec. 5, 2005).
Frank, et al., "HfO2 and Al2O3 Gate Dielectrics on GaAs Grown by Atomic Layer Deposition", Appl. Phys. Lett., vol. 86, No. 15, pp. 152904-4~152904-3.
Gonzalez, C , et al., "Selenium passivation of GaAs(001): a combined experimental and theoretical study", J. Phys. Condens. Matter 16, 2004, pp. 2187-2206.
Jang, H.W. , et al., "Incorporation of Oxygen Donors in AlGaN", Jang, H.W., "Incorporation of Oxygen Donors in AlGaN", J. Electrochem Soc 152, pp. G536-G540, (2004).
Mistele, D , et al., "Incorporation of Dielectric Layers into the Porcessing of III-Nitride-Based Heterosructure Field-Effect Transistors", Journal of Electronic Materials, vol. 32, No. 5, 2003, 9 Pages.
Mori, M. , et al., "Heteroepitaxial Growth of InSb on a Si (0 0 1) Substrate Via AlSb Buffer Layer", Applied Surface Science 216 (2003), 6 pages, 569-574.
Park, K.Y. , et al., "Device Characteristics of AlGaN/GaN MIS-HFET Using A/2O3-HfO3 Laminated High-k Dielectric", Park, K.Y. et al., "Device Characteristics of AlGaN/GaN MIS-HFET Using A/2O3-HfO3 Laminated High-k Dielectric", Japan Journ of Appl. Phys. vol. 43, 2004, pp. L1433-L1435, (2004).
Passlack, Matthias , et al., "Self-Aligned GaAs p-Channel Enhancement Mode MOS Heterostructure Field-Effefct Transistor", IEEE Electron Device Letters, vol. 23, No. 9, Sep. 2002, 3 Pages.
Scholz, S. , et al., "MOVPE growth of GaAs on Ge substrates by inserting a thin low temperature buffer layer", Cryst. Res. Technol. 41, No. 2, (2006), 6 pages, (Jan. 15, 2006), 111-116.
Sieg, R. M., et al., "Toward device-quality GaAs growth by molecular beam epitaxy on offcut Ge/Si_Ge/Si substrates", J. Vac. Sci. Technol. B, vol. 16, No. 3, May/Jun. 1998. 4 pages, 1471-1474.
Stolk, Peter A., et al., Device Modeling Statistical Dopant Fluctuations in MOS Transistors, IEEE Transactions on Electron Devices, (45)9, 1997, 4 pgs.
Wan, A. , et al., "Characterization of GaAs grown by molecular beam epitaxy on vicinal Ge(100) substrates", J. Vac. Sci. Technol. B, vol. 22, No. 4, Jul./Aug. 2004, 6 pages, (Jul. 27, 2004), 1893-1898.

STRESS IN TRIGATE DEVICES USING COMPLIMENTARY GATE FILL MATERIALS

RELATED APPLICATION

This is a Continuation of application Ser. No. 14/273,377 filed May 8, 2014 which is a Continuation of application Ser. No. 13/750,393 filed Jan. 25, 2013 now U.S. Pat. No. 8,741,733 issued Jun. 3, 2014 which is a Divisional of application Ser. No. 12/144,469 filed on Jun. 23, 2008 now U.S. Pat. No. 8,362,566 issued Jan. 29, 2013.

FIELD

Embodiments relate to apparatus, system and method for use of CMOS devices, specifically CMOS devices with stressed channels using complimentary gate fill materials.

BACKGROUND

Metal-oxide-semiconductor field effect transistors (FETs) generally include a substrate made of a semiconductor material, such as silicon or silicon on oxide ("SOI"). The transistors typically include a source region, a channel region and a drain region within the substrate. The channel region is located between the source and the drain regions.

A tri-gate FET is a non-planar FET which may be implemented on either a bulk silicon substrate or an SOI substrate. An SOI transistor differs from a bulk transistor in that its body is not externally biased unless a specific layout is used, such as in a body-contacted transistor. A tri-gate FET uses a raised source/drain to reduce parasitic resistances. The raised channel has an added benefit of allowing for the gate to wrap around the channel. Field effects from the wrap-around gate affect the channel on three sides, thus forming a tri-gate device. The tri-gate device allows for reducing the leakage current when the transistor is in the off state. Tri-gate devices may be fabricated as either an N-type MOS (NMOS) or a P-type MOS (PMOS). Compared to planar transistors at the same off-state leakage current, the tri-gate FET can provide higher NMOS and PMOS drive current. A pair of tri-gate FETs, one NMOS and one PMOS, can be configured together to form a CMOS device. It is desirable to provide a CMOS device having a high drive current.

DETAILED DESCRIPTION

In the following description, numerous specific details are set forth. However, embodiments may be practiced without these specific details. In other instances, well-known circuits, structures and techniques have not been shown in detail in order not to obscure the understanding of this description. The term "a" or "an" in the claims means "one or more."

The following glossary defines terms used herein unless a different meaning is assigned within the context of usage. The Authoritative Dictionary of IEEE Standards Terms, Seventh Edition, should be referenced for terms not otherwise defined herein.

| Acronym | Definition |
| --- | --- |
| DIBL | drain induced barrier lowering |
| Hsi | Channel height |
| Lg | Gate length |
| MPa | Megapascal |
| STI | Shallow trench isolation |
| $W_{SI}$ | Width of Trigate Fin |

Embodiments include a semiconductor device, having a channel raised above a substrate, the channel having a major axis; and a gate wrapped around at least a portion of the channel, the gate aligned substantially perpendicular to the major axis, the gate imparting a stress upon the channel, such that the charge carrier mobility is improved.

Optionally, in the semiconductor device, the gate further includes a gate metal fill that exerts the stress upon the channel.

Optionally, in the semiconductor device, the channel further includes an N-type material; and the gate is configured to produce tensile stress in a current flow direction.

Optionally, in the semiconductor device, the gate is made of a copper gate metal fill.

Optionally, in the semiconductor device, the channel further comprising a P-type material; and the gate is configured to produce compressive stress in a current flow direction.

Optionally, in the semiconductor device, the gate includes a tungsten gate metal fill.

Optionally, the semiconductor device further includes a shallow trench isolation layer between the N and PFET.

Embodiments include a semiconductor device, having a first channel (NFET) raised above a substrate, the first channel having a first major axis; a second channel (PFET) raised above the substrate, the second channel having a second major axis generally parallel to the first major axis, further comprising a material complementary to the material of the first channel; a first gate wrapped around at least a portion of the first channel, the first gate aligned substantially perpendicular to the first major axis, the first gate imparting a stress upon the first channel; and a second gate wrapped around at least a portion of the second channel, the second gate aligned substantially perpendicular to the second major axis, the second gate imparting a stress upon the second channel, further comprising a material complementary to the material of the first gate.

Optionally, in the semiconductor device, the first gate has a depth of 10-100 nm.

Optionally, in the semiconductor device, the second gate has a depth of 10-100 nm.

Optionally, in the semiconductor device, the stress upon the first channel is substantially unequal to the stress upon the second channel.

Embodiments include a method, including raising a channel above a substrate, channel having a major axis; wrapping a gate around at least a portion of the channel, the gate aligned substantially perpendicular to the major axis; and stressing the channel with the stress of the gate.

Optionally, in the method, the stressing improves charge carrier mobility.

Optionally, in the method, the stressing further comprising tensile stressing in current flow direction, wherein the channel comprises is an NFET.

Optionally, in the method, the stressing further includes compressive stressing in current flow direction, wherein the channel comprises a PFET.

Optionally, the method further includes isolating the two different channels (N and P), by using a shallow trench isolation layer embedded in the substrate.

As gate lengths decrease with improved generations of devices, it is increasingly difficult to fabricate the silicon MOSFET devices with reasonably low source-to-drain leakage in the off-state.

Tri-gate transistor structures address the problem of reduced leakage at off-state. The tri-gate transistor includes a thin semiconductor body formed on a substrate. The substrate can be an insulating substrate or a semiconductor substrate. A gate dielectric is formed on the top surface and the sidewalls of the semiconductor body. A gate electrode is formed on the gate dielectric on the top surface of the semiconductor body and is formed adjacent to the gate dielectric formed on the sidewalls of the semiconductor body. Source and drain regions are formed in the semiconductor body on opposite sides of the gate electrode. Because the gate electrode and the gate dielectric surround the semiconductor body on three sides, the transistor essentially has three separate channels when the channel is in the ON state. The "width" of a transistor is equal to the sum of each of the three sides of the semiconductor body. Larger "width" transistors can be formed by connecting several tri-gate transistors together via a common source and drain regions.

Because the width of the trigate transistor is smaller than the depletion width, the formation of a fully depleted transistor is possible. Hence a trigate device is characterized by a very sharp, near-ideal subthreshold slope, and a reduced drain induced barrier lowering ("DIBL") short channel effect of less than about 100 mV/V even at short channel lengths. The lower DIBL effect results in a lower leakage current when a device using tri-gate transistor is turned "OFF", producing lower power consumption.

The amount of current flowing through a channel which has a given electric field across it is generally proportional to the mobility of the carriers in the channel. Thus, by increasing the carrier mobility in the channel, the magnitude of current and operating speed (i.e., the operating frequency) of the transistor can be increased.

Carrier mobility within a semiconductor device substrate can be affected by, for example, mechanical stresses on and within the semiconductor device. That is, certain stresses within a semiconductor device are known to enhance semiconductor device characteristics. For example in Silicon, tensile stress improves electron mobility and degrades hole mobility in the current flow direction, and compressive stress degrades electron mobility and improves hole mobility in the current flow direction. Thus, to improve the characteristics of a semiconductor device, tensile and/or compressive stresses are created in the channel of the n-type devices (e.g., NFETs) and/or p-type devices (e.g., PFETs). The same stress component, for example tensile stress or compressive stress, improves the device characteristics of one type of device (i.e., n-type device or p-type device) while adversely affecting the characteristics of the other type device.

Related art describes adding a material layer on top of a gate electrode to induce stress in a planar MOSFET, for instance when the gate electrode is doped polysilicon. The related art describes NMOS and PMOS devices that require opposite stress states along-the-channel stress because that was relevant to the geometry described in the related art.

The embodiments described herein relate to CMOS devices based on a tri-gate architecture, using stress formed from gate-fill to affect charge carrier mobility. The embodiments focus on a non-planar tri-gate device architecture wherein at least a portion of the gate electrode material is used to generate stress. The non-planar nature of the tri-gate device and the associated wrapping-around of the gate electrode allows additional stress components to be designed for performance gain, for instance, stress normal to the gate plane and stress in the gate plane perpendicular to the current flow direction.

Enhanced carrier mobility due to mechanical stress is proportional to the amount of stress, therefore it is desirable to create as much stress in the semiconductor device substrate as possible, up to the plastic deformation limit of the material. Additionally, stresses in other structures of the device may be generated due to appropriately adjusting characteristics in the deposition process, or introducing stress-producing dopants into the deposition process. Increasing stress by adjusting the deposition process may provide a limited increase in stress. Thus, it is desirable to develop better methods of coupling stress into the channel region of a CMOS device to increase the amount of stress in the channel and enhancing carrier mobility. Applicants have calculated that compressive or tensile stress in the current flow direction may be enhanced by appropriate selection of metallic gate fill materials, i.e., the materials that make up the gate.

Intrinsically stressed gate metal fill exerts stress on the channel. Intrinsic stress is a phenomenon that develops in a thin film during the growth of the thin film. The intrinsic stress is dependent, among other things, on temperature and mechanism of the growth process. Therefore, intrinsic stress is not a property that is inherent to a thin film (e.g., a gate metal film) but rather is a property that has to be engineered into the design and fabrication of the thin film. The design and fabrication of thin films having a desired amount of intrinsic stress is well known to persons of ordinary skill in the art. As used herein, the terms "stress" or "lattice stress" refer to the same phenomenon as intrinsic stress, unless a different meaning is clearly intended, either explicitly or implicitly.

Figure 1:
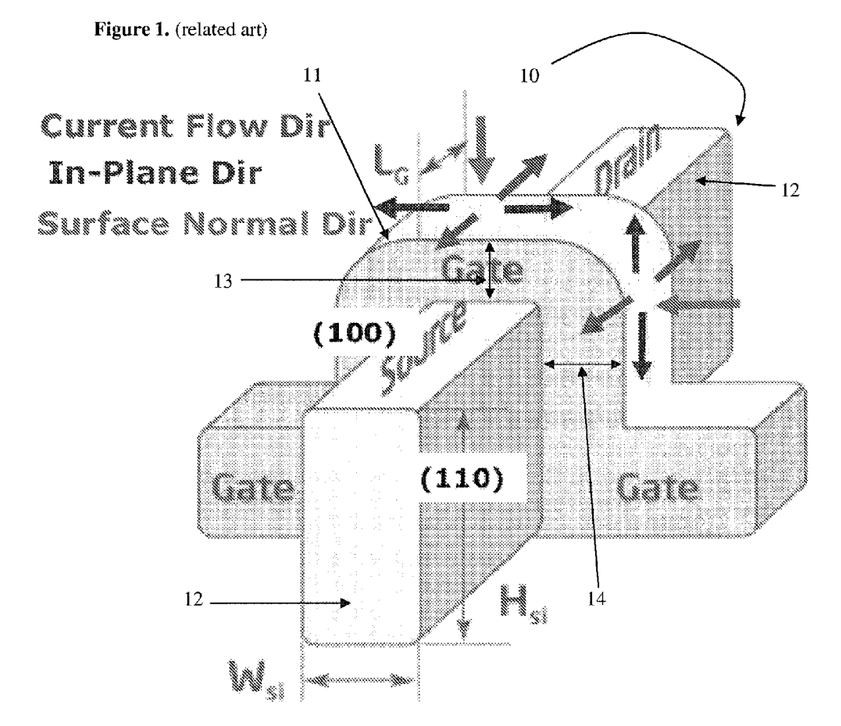
FIG. 1 shows a schematic of a single-fin tri-gate device.

FIG. 1 shows a tri-gate geometry in which the gate 11 wraps around the channel 12, thereby exerting more stress compared to a planar structure. A gate 11 like that shown in FIG. 1 resembles a fin and may be referred to as a fin. Material stress is known to improve charge carrier mobility and hence increases the drive current produced. In a CMOS device, having both N-type and P-type regions, the stress should be applied simultaneously to both types of regions. The amount of stress needed requires metal fills of approximately 10-100 nm in depth along the top 13 and sides 14 of the tri-gate device, and furthermore the stress should be complementary. Preferably, the intrinsic stress beneficial for improving mobility is provided as tensile stress in the current flow direction for N-type devices and as compressive stress in the current flow direction for P-type devices. Gate metal fill that expands, i.e., gate metal fill made of copper, exerts the desired tensile stress upon an N-type tri-gate channel. Metal fill that shrinks, i.e. tungsten, imparts the desired compressive stress in the current flow direction to a P-type tri-gate structure. Hence in a CMOS device, embodiments use complementary metal fills. The stresses in N-type and P-type tri-gate devices may be substantially unequal, but as much stress as possible should be imparted to both N-type and P-type tri-gate devices in order to favorably increase mobility and drive current for both types of devices.

FIG. 1 shows a schematic of a single-fin tri-gate device. Persons skilled in the art will understand that embodiments are not limited to a single fin, and may be practiced using multiple-fin tri-gate devices. The source of the MOSFET is in the foreground and the drain is in the background, with the channel between the source and drain having a major axis defined as the direction between source and drain. Each MOSFET channel has one major axis; however, if a semiconductor device has a plurality of MOSFETs, then there will be a plurality of major axes in total on the semiconductor device. The source and drain have a width and height of $W_{SI}$ and $H_{SI}$, respectively. The gate is shown wrapping around three sides of the junction between the source and drain. The gate length is $L_G$. The arrows in FIG. 1 show the directions of intrinsic stress. Stress in the direction of current flow is shown by the pair of arrows between the source and drain. Similarly, intrinsic stress applied in the "in-plane" direction for the top surface is shown by the pair of arrows pointing left and right. Intrinsic stress applied in the "in-plane" direction for the side-surface is shown by the vertical pair of arrows. The intrinsic stress applied in the "surface normal" direction for the top surface is shown by the vertical arrow. Intrinsic stress applied in the "surface normal" direction for the side surface is shown by the pair of arrows pointing up and down. Persons skilled in the art will also understand that when the tri-gate device is fabricated on an integrated circuit, shallow trench isolation ("STI") layer may be used between N and P-type the tri-gate devices in order to prevent electrical current leakage between adjacent semiconductor device components.

Figure 2:
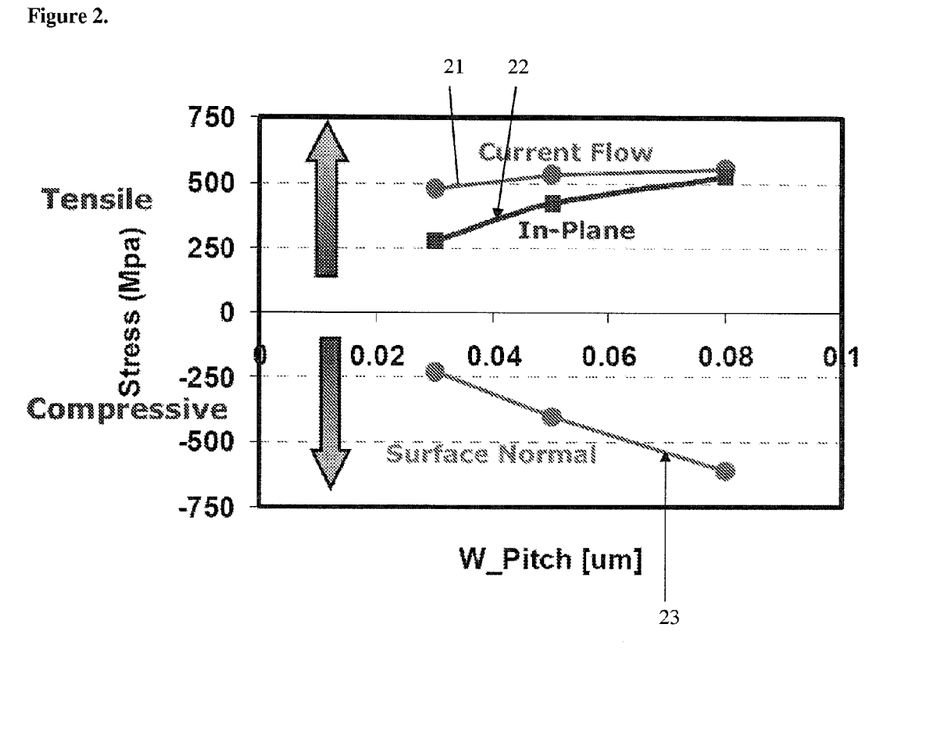
FIG. 2 shows stress in the channel from a 1% stressed copper gate metal fill.

The top half of FIG. 2 shows the tensile stress in the current flow direction 21 and in-plane direction 22 on the tri-gate silicon channel in a tri-gate CMOS device, averaged over the tri-gate area, as a function of the pitch between the N-type and P-type channels, and further assuming a copper metal fill that is intrinsically 1% stressed compared to the relaxed state. The compressive stress in the surface normal direction 23 on the tri-gate silicon channel in the surface normal direction is shown in the bottom half of FIG. 2, also intrinsically 1% stressed compared to the relaxed state. "W_Pitch" is the distance between individual channels, of a particular type of multi-fin device for example multi-fin N-type or multi-fin P-type devices. Increasing tensile stress is shown increasing in the upward direction in the top half of FIG. 2. Increasing compressive stress is shown increasing in the downward direction in the bottom half of FIG. 2.

Figure 3:
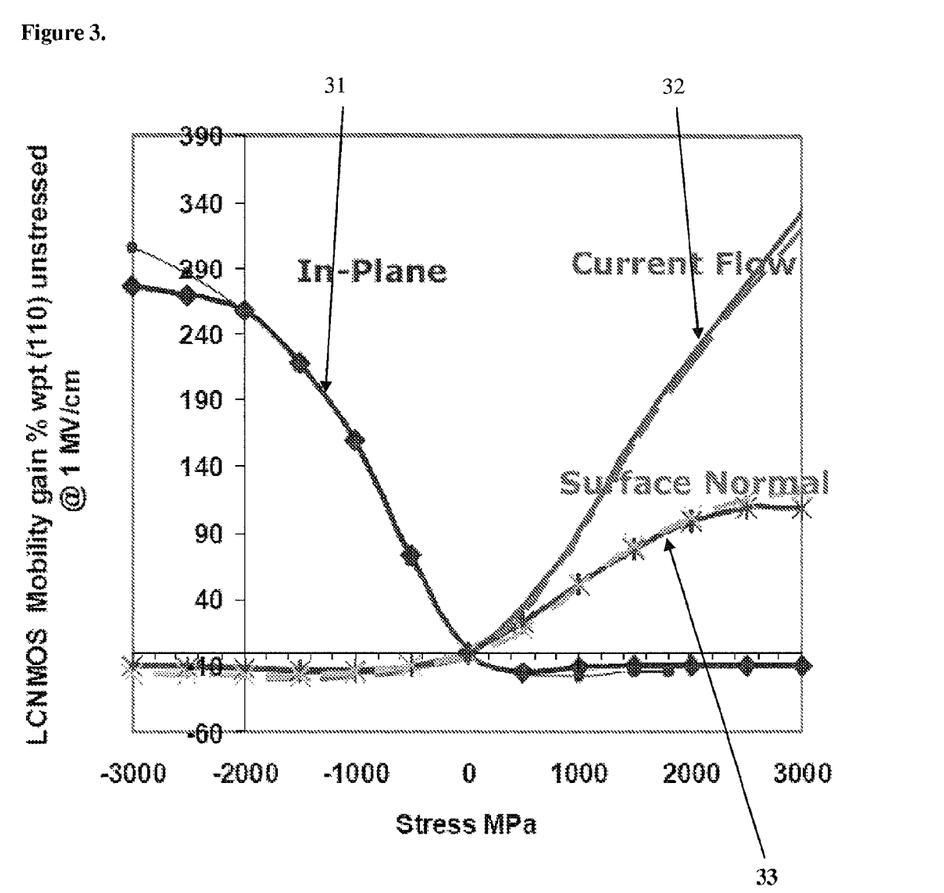
FIG. 3 shows the mobility response to stress for a NMOS device assuming 110 sidewall orientation for the tri-gate device.

FIG. 3 shows the percentage change in electron mobility in Silicon with respect to an unstressed device, as a function of stress applied to a long-channel NMOS tri-gate device (LCNMOS), assuming 110 sidewall orientation for the tri-gate device. Although the stress response is illustrated assuming (110) sidewall surface for a tri-gate LCNMOS device, persons skilled in the art will understand that the mobility enhancement is not limited to (110) surface orientations. The electric field is at 1 MV/cm. A pair of curves are presented for stress applied in each of the three directions (in-plane 31, current flow 32, and surface normal 33). Tensile stress (i.e., positive stress) is on the right side of FIG. 3, and compressive stress (i.e., negative stress) is on the left side of FIG. 3. Each pair of curves represents two calculations of the resulting stress.

Figure 4:
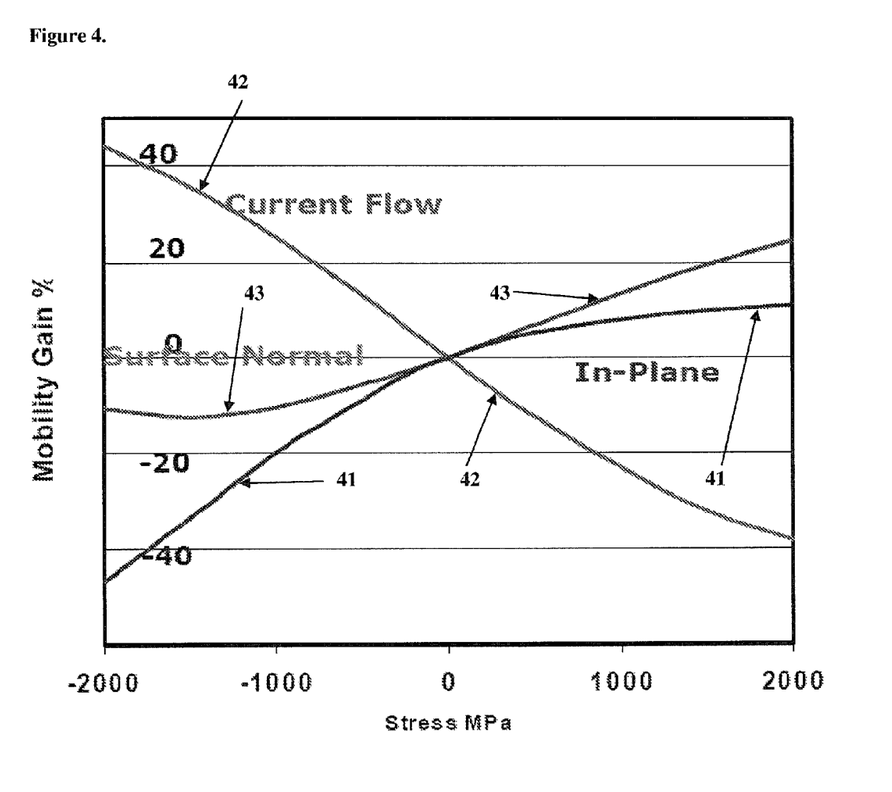
FIG. 4 shows the mobility response to stress for a PMOS device assuming 110 sidewall orientation for the tri-gate device.

FIG. 4 presents a similar increase in mobility in Silicon arising from the application of stress for PMOS. The percentage change in hole mobility with respect to an unstressed device is presented as a function of stress applied in all three dimensions (in-plane 41, current flow 42, and surface normal 43) to a long-channel PMOS tri-gate device (LCPMOS), assuming 110 sidewall orientation for the tri-gate device.

Figure 5:
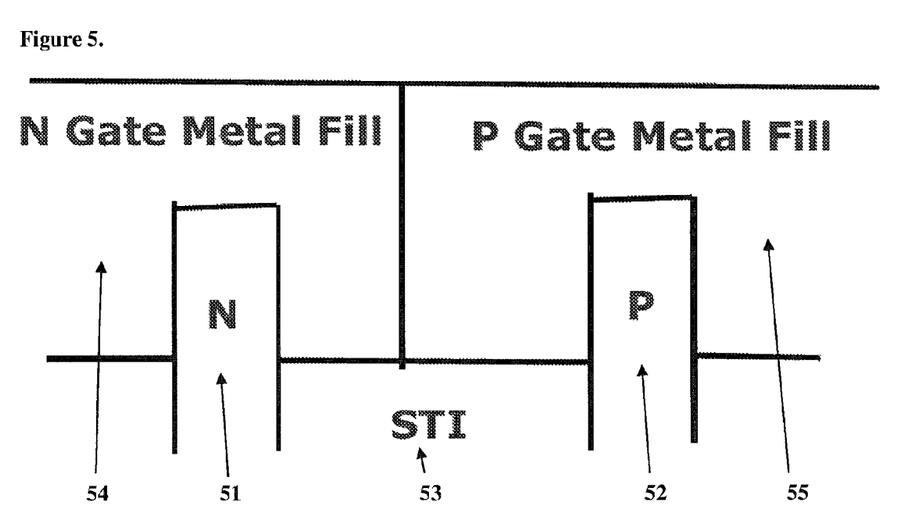
FIG. 5 shows a schematic of two different gate metal fills for N and P tri-gate devices.

FIG. 5 shows a cross-sectional view of two tri-gate devices 10 of FIG. 1, configured side-by-side to produce for instance a CMOS device. The cross-section is taken through the gate structures 54 and 55, showing the two different gate metal fills for the N-type and P-type tri-gate devices. The source-to-drain N-type channel 51 and the source-to-drain P-type channel 52 are shown in cross-section, with current flow in a direction perpendicular to the cross-section. The STI 53 is a layer of material that prevents electrical current leakage to or from the tri-gate devices.

Other embodiments contemplate methods of fabricating the above-described embodiments, methods of using the above-described embodiments, and apparatus or systems using the above-described embodiments.

This application may disclose several numerical range limitations that support any range within the disclosed numerical ranges even though a precise range limitation is not stated verbatim in the specification because the embodiments could be practiced throughout the disclosed numerical ranges. Finally, the entire disclosure of the patents and publications referred in this application, if any, are hereby incorporated herein in entirety by reference.

The invention claimed is:

1. A semiconductor device, comprising:
   a first channel comprising an N-type material and a first current flow direction along a first major axis of the first channel;
   a second channel comprising a P-type material and a second current flow direction along a second major axis of the second channel;
   a gate electrode structure disposed on the first and second channels, the gate electrode structure comprising a first metal disposed over the first channel that exerts a tensile stress upon the first channel such that charge carrier mobility in the first channel is improved in the first current flow direction, and the gate electrode structure comprising a second metal disposed over the second channel that exerts a compressive stress upon the second channel such that charge carrier mobility in the second channel is improved in the second current flow direction, wherein the first metal is different than the second metal; and
   an isolation structure between the first channel and the second channel, wherein the first metal and the second metal are laterally in contact with one another above the isolation structure.

2. The semiconductor device of claim 1, wherein the first metal has a thickness of 10-100 nm.

3. The semiconductor device of claim 1, wherein the second metal has a thickness of 10-100 nm.

4. The semiconductor device of claim 1, wherein the tensile stress exerted upon the first channel is substantially unequal to the compressive stress exerted upon the second channel.

5. The semiconductor device of claim 1, wherein the first metal comprises copper.

6. The semiconductor device of claim 1, wherein the second metal comprises tungsten.

7. The semiconductor device of claim 1, wherein the first metal comprises copper, and the second metal comprises tungsten.

8. The semiconductor device of claim 1, wherein the substrate is a bulk silicon substrate.

9. The semiconductor device of claim 1, wherein the substrate is a silicon on insulator (SOI) substrate.

10. The semiconductor device of claim 1, wherein the first gate is substantially perpendicular to the first major axis.

11. The semiconductor device of claim 1, wherein the second gate is substantially perpendicular to the second major axis.

12. The semiconductor device of claim 1, wherein the first major axis is parallel with the second major axis.

13. A semiconductor device, comprising:
a first channel comprising an N-type semiconductor body and a first current flow direction along a first major axis of the first channel;
a second channel comprising a P-type semiconductor body and a second current flow direction along a second major axis of the second channel;
a gate electrode structure disposed on the first and second channels, the gate electrode structure comprising a first metal disposed over the first channel that exerts a tensile stress upon the first channel such that charge carrier mobility in the first channel is improved in the first current flow direction, and the gate electrode structure comprising a second metal disposed over the second channel that exerts a compressive stress upon the second channel such that charge carrier mobility in the second channel is improved in the second current flow direction, wherein the first metal is different than the second metal; and
an isolation structure between the first channel and the second channel, wherein the first metal and the second metal are laterally in contact with one another above the isolation structure.

14. The semiconductor device of claim 13, wherein the tensile stress exerted upon the first channel is substantially unequal to the compressive stress exerted upon the second channel.

15. The semiconductor device of claim 13, wherein the first metal comprises copper, and the second metal comprises tungsten.

16. The semiconductor device of claim 13, wherein the substrate is a bulk silicon substrate.

17. The semiconductor device of claim 13, wherein the substrate is a silicon on insulator (SOI) substrate.

18. The semiconductor device of claim 13, wherein the first gate is substantially perpendicular to the first major axis.

19. The semiconductor device of claim 13, wherein the second gate is substantially perpendicular to the second major axis.

20. The semiconductor device of claim 13, wherein the first major axis is parallel with the second major axis.

* * * * *